United States Patent
Smith et al.

(10) Patent No.: US 10,043,656 B1
(45) Date of Patent: Aug. 7, 2018

(54) SELECTIVE GROWTH OF SILICON OXIDE OR SILICON NITRIDE ON SILICON SURFACES IN THE PRESENCE OF SILICON OXIDE

(71) Applicant: Lam Research Corporation, Fremont, CA (US)

(72) Inventors: David Charles Smith, Lake Oswego, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/456,301

(22) Filed: Mar. 10, 2017

(51) Int. Cl.
| | | |
|---|---|---|
| C23C 16/22 | (2006.01) | |
| H01L 21/02 | (2006.01) | |
| C23C 16/04 | (2006.01) | |
| C23C 16/34 | (2006.01) | |
| C23C 16/40 | (2006.01) | |
| C23C 16/455 | (2006.01) | |

(52) U.S. Cl.
CPC .......... *H01L 21/0217* (2013.01); *C23C 16/04* (2013.01); *C23C 16/345* (2013.01); *C23C 16/401* (2013.01); *C23C 16/45534* (2013.01); *C23C 16/45542* (2013.01); *C23C 16/45553* (2013.01); *H01L 21/02164* (2013.01); *H01L 21/02211* (2013.01); *H01L 21/02271* (2013.01)

(58) Field of Classification Search
CPC .... C07F 7/025; C07F 7/21; C07F 7/10; H01L 21/0217; H01L 21/02126; H01L 21/02164; H01L 21/02167; H01L 21/02274; H01L 21/0228; H01L 21/0234; H01L 21/02532; H01L 21/02592; H01L 21/0262; H01L 21/02381; H01L 21/0245; C23C 16/24
See application file for complete search history.

(56) References Cited

U.S. PATENT DOCUMENTS

| | | |
|---|---|---|
| 4,539,061 A | 9/1985 | Sagiv |
| 6,593,000 B2 | 7/2003 | Ohtake et al. |
| 7,875,312 B2 | 1/2011 | Thridandam et al. |

(Continued)

OTHER PUBLICATIONS

Chabal* et al. (2016) "Atomic Layer Deposition of Silicon Dioxide Using Aminosilanes Di-sec-butylaminosilane and Bis(tert-butylamino)silane with Ozone," *The Journal of Physical Chemistry C*, ACS Publications, American Chemical Society, 120:10927-10935.

(Continued)

*Primary Examiner* — William F Kraig
*Assistant Examiner* — Edward Chin
(74) *Attorney, Agent, or Firm* — Weaver Austin Villeneuve & Sampson LLP

(57) ABSTRACT

Methods and apparatuses for selectively depositing silicon-containing dielectric or metal-containing dielectric material on silicon or metal surfaces selective to silicon oxide or silicon nitride materials are provided herein. Methods involve exposing the substrate to an acyl chloride which is reactive with the silicon oxide or silicon nitride material where deposition is not desired to form a ketone structure that blocks deposition on the silicon oxide or silicon nitride material. Exposure to the acyl chloride is performed prior to deposition of the desired silicon-containing dielectric material or metal-containing dielectric material.

13 Claims, 7 Drawing Sheets

(56) References Cited

U.S. PATENT DOCUMENTS

| | | | |
|---|---|---|---|
| 8,043,907 B2 | 10/2011 | Ma et al. | |
| 8,530,361 B2 | 9/2013 | Xiao et al. | |
| 8,592,005 B2 | 11/2013 | Ueda | |
| 8,668,957 B2 | 3/2014 | Dussarrat et al. | |
| 8,821,986 B2 | 9/2014 | Weidman et al. | |
| 8,853,075 B2 | 10/2014 | Gatineau et al. | |
| 8,940,648 B2 | 1/2015 | Xiao et al. | |
| 8,945,305 B2 | 2/2015 | Marsh | |
| 9,219,007 B2 | 12/2015 | Chen et al. | |
| 9,257,334 B2 | 2/2016 | Chen et al. | |
| 9,331,094 B2 | 5/2016 | Hada | |
| 9,371,338 B2 | 6/2016 | Dussarrat et al. | |
| 2006/0128142 A1 | 6/2006 | Whelan et al. | |
| 2008/0032064 A1 | 2/2008 | Gordon et al. | |
| 2011/0178092 A1* | 7/2011 | Ali | C07C 233/36 514/252.01 |
| 2011/0256721 A1 | 10/2011 | Gatineau | |
| 2012/0205315 A1* | 8/2012 | Liu | B01J 20/286 210/656 |
| 2014/0252486 A1 | 9/2014 | Lin et al. | |
| 2014/0363969 A1 | 12/2014 | Chen et al. | |
| 2015/0147871 A1* | 5/2015 | Xiao | H01L 21/02126 438/482 |
| 2015/0155523 A1 | 6/2015 | Kamiya | |
| 2015/0299848 A1 | 10/2015 | Haukka et al. | |
| 2015/0364372 A1 | 12/2015 | Chen et al. | |
| 2015/0371896 A1 | 12/2015 | Chen et al. | |
| 2016/0024647 A1* | 1/2016 | Saly | C23C 16/56 427/255.394 |
| 2016/0126106 A1 | 5/2016 | Shimizu et al. | |
| 2016/0280724 A1* | 9/2016 | Arkles | C01B 21/068 |
| 2017/0029947 A1 | 2/2017 | Kawahara et al. | |
| 2017/0029948 A1 | 2/2017 | Jongbloed et al. | |
| 2017/0148642 A1 | 5/2017 | Wang et al. | |

OTHER PUBLICATIONS

Chen, Rong and Bent*, Stacey F. (2006) "Chemistry for Positive Pattern Transfer Using Area-Selective Atomic Layer Deposition," *Adv. Mater.*, 18:1086-1090.

Chen et al. (2011) "Ozone-Based Atomic Layer Deposition of Crystalline $V_2O_5$ Films for High Performance Electrochemical Energy Storage" *Chemistry of Materials*, ACS Publications, American Chemical Society, 7pp.

Dangerfield et al. (2016) "Role of Trimethylaluminum (TMA) for Low Temperature $SiN_x$ Deposition: Growth Dependence on Number of TMA Exposures," *ALD Conference 2016*, 14pp.

Han et al. (2012) "On the Mechanisms of $SiO_2$ Thin-Film Growth by the Full Atomic Layer Deposition Process Using Bis(t-butylamino)silane on the Hydroxylated SiO2(001) Surface," *The Journal of Physical Chemistry C*, ACS Publications, American Chemical Society, 116:947-952.

Huang et al. (2017) "Design of efficient mono-aminosilane precursors for atomic layer deposition of SiO2 thin films," Royal Society of Chemistry Adv. 2017, 7:22672-22678.

Li et al. (2014) "Low Temperature (LT) Thermal ALD Silicon Dioxide Using Ozone Process," *Arradiance Inc.*, Sudbury, MA USA, 1 page.

Liu et al. (Jun. 26-29, 2011) "High Rate Growth of $SiO_2$ by Thermal ALD Using Tris(di-methylamino)silane and Ozone," ALD 2011, *Cambridge NanoTech Inc.*, Cambridge, MA, USA, 14pp.

Ooba et al. (1998) "Self-Limiting Atomic-layer Selective Deposition of Silicon Nitride by Temperature-Controlled Method," *Extended Abstracts of the 1998 International Conference on Solid State Devices and Materials*, Hiroshima, pp. 22-23.

Putkonen et al. (2014) "Thermal and plasma enhanced atomic layer deposition of $SiO_2$ using commercial silicon precursors," *Thin Solid Films*, 558:93-98.

Sundstrom, (Dec. 2005) "Ozone as the Oxidizing Precursor in Atomic Layer Deposition," *Gas & Chemicals, MKS Instruments, Inc.*, Wilmington, MA, 4pp.

Yokoyama et al. (1998) "Atomic-layer selective deposition of silicon nitride on hydrogen-terminated Si surfaces," *Applied Surface Science*, 130-132, 352-356.

U.S. Appl. No. 15/432,634, filed Feb. 14, 2017, Smith et al.
U.S. Appl. No. 15/452,815, filed Mar. 8, 2017, Smith et al.
U.S. Appl. No. 15/462,695, filed Mar. 17, 2017, Smith et al.
U.S. Appl. No. 15/581,951, filed Apr. 28, 2017, Reddy et al.
U.S. Appl. No. 15/821,590, filed Nov. 22, 2017, Hausmann et al.
U.S. Office Action, dated Nov. 16, 2017, issued in U.S. Appl. No. 15/432,634.
U.S. Notice of Allowance, dated Oct. 20, 2017, issued in U.S. Appl. No. 15/462,695.

\* cited by examiner

SELECTIVE GROWTH OF SILICON OXIDE OR SILICON NITRIDE ON SILICON SURFACES IN THE PRESENCE OF SILICON OXIDE

BACKGROUND

Semiconductor device fabrication may involve deposition of silicon nitride and silicon oxide films. Such films are used in a variety of applications. For example, silicon nitride films may be used in diffusion barriers, gate insulators, sidewall spacers, encapsulation layers, strained films in transistors, and the like. Silicon oxide films, for example, may be used in self aligned double patterning, and/or quad patterning or other fabrication processes. Conventional techniques for depositing silicon oxide and silicon nitride films are not selective relative to other silicon-containing material on the substrate.

SUMMARY

Provided herein are methods and apparatuses for processing substrates. One aspect involves a method for selectively depositing a silicon-containing dielectric material on an exposed first surface of a substrate, the method including: providing the substrate having the exposed first surface, and an exposed second surface, the exposed first surface having a material such as any of polysilicon, amorphous silicon, metals, and silicon nitride having single secondary amine-terminated groups, and the exposed second surface including a silicon-containing material having surface terminated groups such as hydroxyls or primary amines; prior to depositing the silicon-containing dielectric material, exposing the substrate to an acyl chloride selectively reactive with the exposed second surface to form blocking groups on the exposed second surface, the acyl chloride having a chemical structure of

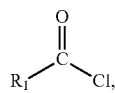

whereby $R_1$ is hydrogen or an alkyl group; and performing one or more cycles of thermal atomic layer deposition to deposit the silicon-containing dielectric material selectively on the exposed first surface, each cycle including: exposing the substrate to a silicon-containing precursor selected to adsorb onto the exposed first surface of the substrate, and exposing the substrate to a second reactant to form the silicon-containing dielectric material selectively on the exposed first surface of the substrate.

In various embodiments, the silicon-containing dielectric material is silicon nitride. For example, the second reactant may be any of ammonia or a hydrazine having the chemical structure

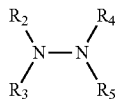

whereby $R_2$, $R_3$, $R_4$, and $R_5$ are each hydrogen or an alkyl group. In some embodiments, the silicon-containing precursor is a silicon halide or aminosilane. Example silicon halides include silicon chloride, silicon bromide, and silicon iodide. For example, in some embodiments, the silicon-containing precursor is silicon tetrachloride. In some embodiments, the silicon-containing precursor is silicon tetrachloride. In some embodiments, the silicon-containing precursor is silicon tetrabromide. In some embodiments, the silicon-containing precursor is silicon tetraiodide.

In some embodiments, the silicon-containing precursor is an aminosilane having the chemical structure

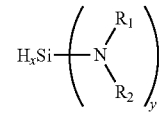

where x is an integer between and including 1 and 3, $x+y=4$ and each of $R_1$ and $R_2$ is hydrogen or an alkyl ligand.

In various embodiments, the silicon-containing dielectric material is silicon oxide. For example, the second reactant may be a weak oxidant. In some embodiments, the second reactant is any one of water, hydrogen peroxide, and ozone.

In various embodiments, the acyl chloride is acetyl chloride.

In various embodiments, the method also includes, prior to providing the substrate, depositing silicon nitride to form an untreated silicon nitride surface; and exposing the untreated silicon nitride surface to a mixture of ammonia and hydrogen gas and igniting a plasma for a duration between about 1 second and about 10 seconds to form the exposed second surface including primary amine groups. In some embodiments, the amount of ammonia in the mixture of ammonia and hydrogen is less than about 1% by volume.

In various embodiments, the method also includes, prior to providing the substrate, depositing silicon nitride to form an untreated silicon nitride surface and exposing the untreated silicon nitride surface to a mixture of nitrogen and hydrogen gas and igniting a plasma for a duration between about 1 second and about 10 seconds to form the exposed first second including primary amine groups. In some embodiments, the amount of nitrogen in the mixture of nitrogen and hydrogen is less than about 1% by volume.

In some embodiments, the exposed second surface including surface terminated primary amine groups of silicon nitride is deposited by chemical vapor deposition at a deposition temperature greater than about 500° C. In various embodiments, each cycle of thermal atomic layer deposition also includes purging a chamber housing the substrate between exposing the substrate to the silicon-containing precursor and exposing the substrate to the second reactant. In various embodiments, each cycle of thermal atomic layer deposition also includes purging a chamber housing the substrate after exposing the substrate to the silicon-containing precursor and purging the chamber after exposing the substrate to the second reactant. In various embodiments, purging is performed by delivering an inert gas to the chamber housing the substrate. The inert gas may be any of helium, argon, neon, and combinations thereof.

Another aspect involves a method for selectively depositing a metal-containing dielectric material on an exposed first surface of a substrate, the method including: providing the substrate having the exposed first surface, and an exposed second surface, the exposed first surface having a material selected from the group consisting of polysilicon, amorphous silicon, metals, and silicon nitride having single secondary amine terminated groups, and the exposed second surface including a silicon-containing material having surface terminated groups selected from the group consisting of hydroxyl and primary amine; prior to depositing the metal-containing dielectric material, exposing the substrate to an acyl chloride selectively reactive with the exposed second surface to form blocking groups on the exposed second surface, the acyl chloride having a chemical structure of

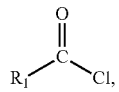

whereby $R_1$ is hydrogen or an alkyl group; and performing one or more cycles of thermal atomic layer deposition to deposit the metal-containing dielectric material selectively on the exposed first surface.

In various embodiments, the metal-containing dielectric material any one of zirconium oxide ($ZrO_2$), titanium oxide ($TiO_2$), tin oxide ($SnO_2$), hafnium oxide ($HfO_2$), and titanium nitride (TiN).

In various embodiments, the acyl chloride is acetyl chloride.

The method may also include, prior to providing the substrate, depositing silicon nitride to form an untreated silicon nitride surface; and exposing the untreated silicon nitride surface to a mixture of ammonia and hydrogen gas and igniting a plasma for a duration between about 1 second and about 10 seconds to form the exposed second surface including primary amine groups. In some embodiments, the amount of ammonia in the mixture of ammonia and hydrogen is less than about 1% by volume.

The method may also include, prior to providing the substrate, depositing silicon nitride to form an untreated silicon nitride surface and exposing the untreated silicon nitride surface to a mixture of nitrogen and hydrogen gas and igniting a plasma for a duration between about 1 second and about 10 seconds to form the exposed first second including primary amine groups. In some embodiments, the amount of nitrogen in the mixture of nitrogen and hydrogen is less than about 1% by volume.

In various embodiments, the exposed second surface including surface terminated primary amine groups of silicon nitride is deposited by chemical vapor deposition at a deposition temperature greater than about 500° C. In various embodiments, each cycle of thermal atomic layer deposition also includes purging a chamber housing the substrate between exposing the substrate to the metal-containing precursor and exposing the substrate to the second reactant. In various embodiments, each cycle of thermal atomic layer deposition also includes purging a chamber housing the substrate after exposing the substrate to the metal-containing precursor and purging the chamber after exposing the substrate to the second reactant. In various embodiments, purging is performed by delivering an inert gas to the chamber housing the substrate. The inert gas may be any of helium, argon, neon, and combinations thereof.

In various embodiments, the second reactant is an oxidant. In various embodiments, the second reactant is a nitrogen-containing gas, such as ammonia, nitrogen, or a hydrazine.

Another aspect involves an apparatus for processing semiconductor substrates, the apparatus including: at least one process chamber including a pedestal for holding a substrate; at least one outlet for coupling to a vacuum; one or more process gas inlets coupled to one or more acyl chloride gas sources; one or more process gas inlets coupled to one or more silicon-containing precursor gas sources; one or more process gas inlets coupled to one or more second reactant gas sources; and a controller for controlling operations in the apparatus, including machine-readable instructions for: prior to introducing a silicon-containing precursor gas or a second reactant gas, introducing an acyl chloride to the substrate housed in the at least one process chamber; and introducing the silicon-containing precursor gas and the second reactant gas in temporally separated pulses to form a silicon-containing dielectric film, whereby a pulse of the silicon-containing precursor gas and a pulse of the second reactant gas constitutes one thermal atomic layer deposition cycle.

In various embodiments, the silicon-containing precursor gas source includes any one of silicon halide gases and aminosilane gases. For example, in some embodiments, the silicon-containing precursor gas is silicon chloride, or silicon bromide, or silicon iodide, or combinations thereof. In various embodiments, the second reactant gas source includes a weak oxidant gas. In various embodiments, the second reactant gas source includes water vapor, hydrogen peroxide gas, ozone gas, or combinations thereof. In various embodiments, the second reactant gas source is a nitrogen-containing gas, such as nitrogen, ammonia, a hydrazine, or combinations thereof. In various embodiments, the one or more acyl chloride gas sources includes an acetyl chloride gas source and the acyl chloride introduced to the substrate is acetyl chloride.

In various embodiments, the controller also includes instructions for purging the at least one process chamber between the temporally separated pulses of the silicon-containing precursor gas and the second reactant gas. In some embodiments, the apparatus also includes one or more gas inlets coupled to one or more inert gas sources, and the instructions for purging includes instructions for flowing inert gas from the one or more inert gas sources to the at least one process chamber housing the substrate.

An apparatus for processing semiconductor substrates, the apparatus including: at least one process chamber including a pedestal for holding a substrate; at least one outlet for coupling to a vacuum; one or more process gas inlets coupled to one or more acyl chloride gas sources; one or more process gas inlets coupled to one or more metal-containing precursor gas sources; one or more process gas inlets coupled to one or more second reactant gas sources; and a controller for controlling operations in the apparatus, including machine-readable instructions for: prior to introducing a metal-containing precursor gas or a second reactant gas, introducing an acyl chloride to the substrate housed in the at least one process chamber; and introducing the metal-containing precursor gas and the second reactant gas in temporally separated pulses to form a metal-containing dielectric film, whereby a pulse of the metal-containing precursor gas and a pulse of the second reactant gas constitutes one thermal atomic layer deposition cycle.

In various embodiments, the second reactant gas source includes a weak oxidant gas. In various embodiments, the second reactant gas source includes water vapor, hydrogen peroxide gas, ozone gas, or combinations thereof. In various embodiments, the second reactant gas source is a nitrogen-containing gas, such as nitrogen, ammonia, a hydrazine, or combinations thereof. In various embodiments, the one or more acyl chloride gas sources includes an acetyl chloride gas source and the acyl chloride introduced to the substrate is acetyl chloride.

In various embodiments, the controller also includes instructions for purging the at least one process chamber between the temporally separated pulses of the metal-containing precursor gas and the second reactant gas. In some embodiments, the apparatus also includes one or more gas inlets coupled to one or more inert gas sources, and the instructions for purging includes instructions for flowing inert gas from the one or more inert gas sources to the at least one process chamber housing the substrate.

These and other aspects are described further below with reference to the drawings.

DETAILED DESCRIPTION

Figure 1:
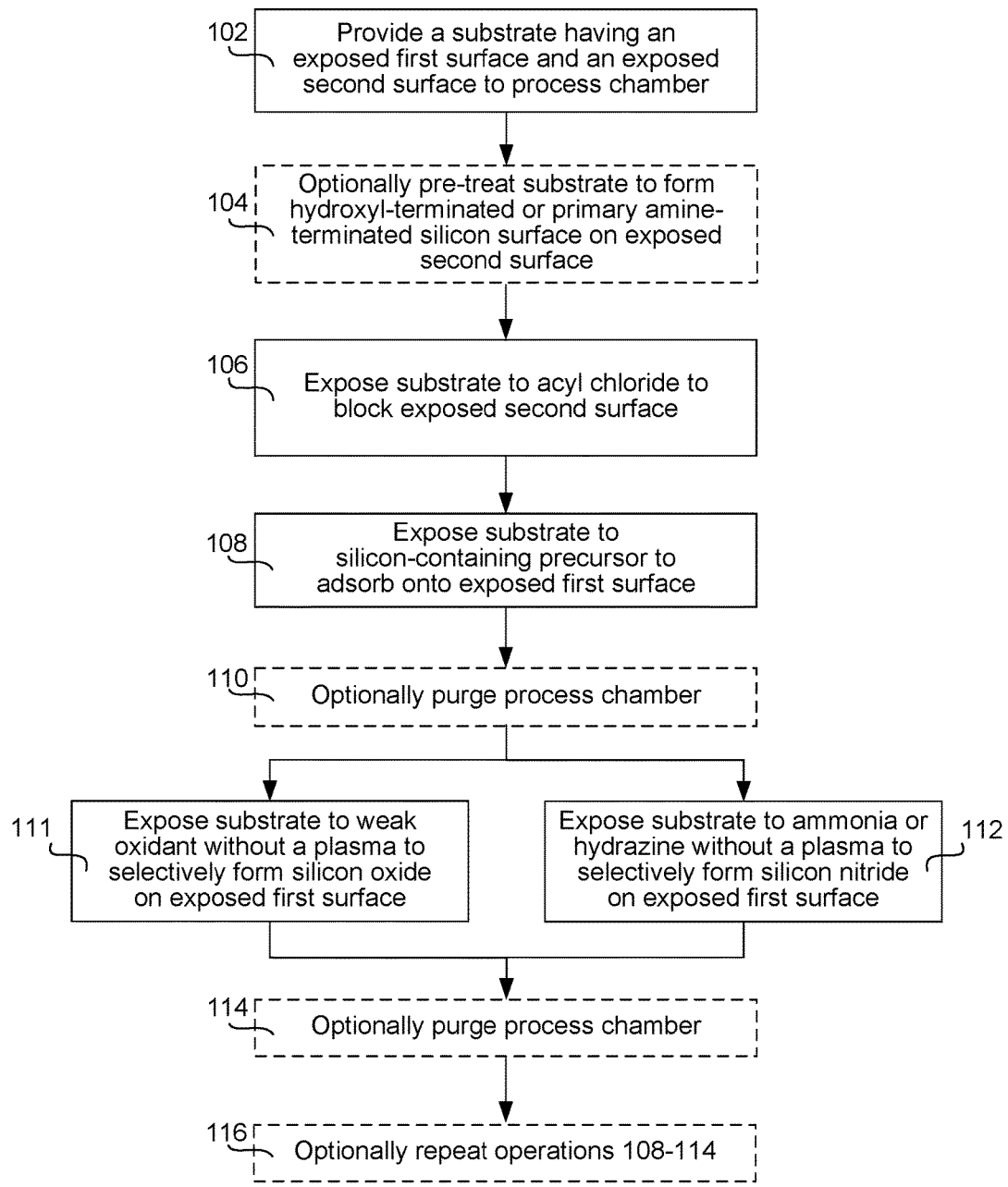
FIG. 1 is a process flow diagram depicting operations for a method in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve deposition of silicon oxide, silicon nitride, metal oxide, and metal nitride materials. In one example, silicon oxide may be used as spacers and double patterning, quad patterning, and other multiple patterning fabrication techniques. In another example, silicon nitride may be used in semiconductor device fabrication as diffusion barriers, gate insulators, sidewall spacers, and encapsulation layers. Conformal silicon nitride layers may also be used in other applications such as during fabrication of memory structures. Conventional atomic layer deposition (ALD), plasma-enhanced atomic layer deposition (PEALD), chemical vapor deposition (CVD), and plasma-enhanced chemical vapor deposition (PECVD) techniques for depositing silicon oxide and silicon nitride layers are generally not selective to the material the silicon oxide or silicon nitride material is being deposited on. Although some techniques exist for selectively depositing metal oxide on oxide materials relative to metal, and selectively depositing metal oxide on metal materials relative to oxide, such techniques are insufficient to effectively deposit dielectric material selectively relative to other dielectric material.

Provided herein are methods for selectively depositing silicon-containing dielectric material or metal-containing dielectric material on a first exposed surface of a semiconductor substrate relative to a silicon oxide or silicon nitride surface. Methods include using an acyl chloride during deposition of the material to selectively block exposed silicon oxide or silicon nitride surfaces. Materials that may be deposited using certain disclosed embodiments include silicon-containing dielectric materials such as silicon oxide and silicon nitride, and metal-containing dielectric materials, such as metal oxides and nitrides. Example metal-containing dielectric materials include zirconium oxide ($ZrO_2$), titanium oxide (e.g., $TiO_2$), tin oxide (e.g., $SnO_2$), hafnium oxide ($HfO_2$), and titanium nitride (TiN). The silicon oxide, silicon nitride, or metal-containing dielectric material is deposited selectively on a silicon surface, such as polysilicon having a Si—H terminated surface; silicon nitride surface having secondary amines on the surface (e.g., Si—NH terminated surface); or metal-containing dielectric surface. Silicon oxide, silicon nitride, or metal-containing dielectric material is deposited using deposition precursors, deposition techniques, and deposition process conditions selected so as not to damage or remove the blocked regions of the exposed silicon oxide or silicon nitride surfaces. The blocked silicon oxide or silicon nitride surfaces are formed by reacting the hydroxyl-terminated silicon oxide or primary amine-terminated (Si—$NH_2$) silicon nitride surfaces with an acyl chloride to form one or more blocking groups such as aldehydes and/or ketones such that the aldehyde and/or ketone has little to no reactivity with the deposition precursors for selectively depositing silicon oxide, silicon nitride, or metal-containing dielectric material.

Techniques described herein involve thermal atomic layer deposition (ALD). That is, in various embodiments, the reaction between a silicon-containing precursor and a weak oxidant to form silicon oxide is performed without igniting a plasma. Additionally, in various embodiments, the reaction between a silicon-containing precursor and hydrazine to form silicon nitride is performed without igniting a plasma. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As another example, a silicon oxide deposition cycle may include the following operations: (i) delivery/adsorption of a silicon-containing precursor, (ii) purging of the silicon-containing precursor from the chamber, (iii) delivery of a weak oxidant gas, and (iv) purging of the weak oxidant gas from the chamber. As an example, a silicon nitride deposition cycle may include the following operations: (i) delivery/adsorption of a silicon-containing precursor, (ii) purging of the silicon-containing precursor from the chamber, (iii) delivery of a hydrazine gas, and (iv) purging of the hydrazine gas from the chamber.

Unlike a chemical vapor deposition (CVD) technique, ALD processes use surface mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as hydrazine or a weak oxidant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

In some implementations, ALD methods may include plasma activation. However, in thermal ALD processes described herein, plasma is not ignited. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIG. 1 is a process flow diagram depicting example operations of a method performed in accordance with certain disclosed embodiments. In operation 102, a substrate having an exposed first surface and an exposed second surface is provided to a process chamber. The process chamber may be set to a chamber pressure between about 10 mTorr and about 10 Torr, or between about 1 Torr and about 3 Torr. Such chamber pressures may be used throughout operations 102-116 as described herein. The substrate may be heated to a substrate temperature between about 25° C. and about 400° C., or between about 200° C. and about 300° C. It will be understood that substrate temperature as used herein refers to the temperature that the pedestal holding the substrate is set at and that in some embodiments, the substrate when provided to the process chamber on the pedestal may be heated to the desired substrate temperature prior to processing the substrate. The substrate temperature may be the same throughout operations 102-116 as described herein.

The substrate may be a silicon wafer, e.g., a 200-mm wafer, a 300-mm wafer, or a 450 mm wafer, including wafers having one or more layers of material, such as dielectric, conducting, or semi conducting material deposited thereon. Non-limiting examples of under layers include dielectric layers and conducting layers, e.g., silicon oxides, silicon nitrides, silicon carbides, metal oxides, metal nitrides, metal carbides, and metal layers. In some embodiments, the substrate includes silicon oxide and silicon.

As used herein, the exposed first surface is the surface upon which material is to be selectively deposited on. This surface may be a hydrogen-terminated silicon surface, such as the surface of a silicon material, such as poly-silicon or amorphous silicon. A hydrogen-terminated silicon surface may be formed by exposing the substrate to a hydrogen gas to hydrogenate the silicon atoms on the surface of the substrate. In another embodiment, the first surface may be a primary amine terminated silicon surface, such as the surface of a silicon nitride material. Note that while the surface may have a primary amine terminated surface, secondary amine terminated surfaces of a silicon nitride material is not a suitable exposed first surface for depositing material because it is reactive with acyl chlorides. In other embodiments, the exposed first surface is a metal surface, such as a titanium surface, a nickel surface, or a copper surface. The exposed first surface does not include material or end groups that are highly reactive with an acyl chloride.

As used herein, the exposed second surface is the surface where material is not to be deposited on. That is, material is to be deposited on the exposed first surface relative to the exposed second surface. Embodiments described herein are suitable for depositing silicon-containing dielectric material or metal-containing dielectric material on an exposed first surface relative to an exposed second surface. The exposed second surface may be silicon oxide or silicon nitride.

Figure 2:
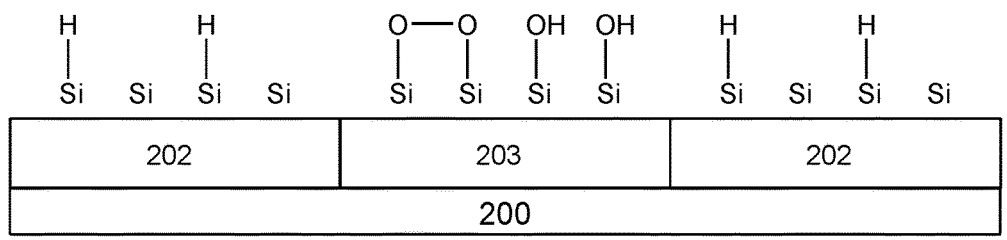
FIGS. 2-9 are schematic illustrations of substrates undergoing operations described in accordance with certain disclosed embodiments.
Figure 5:
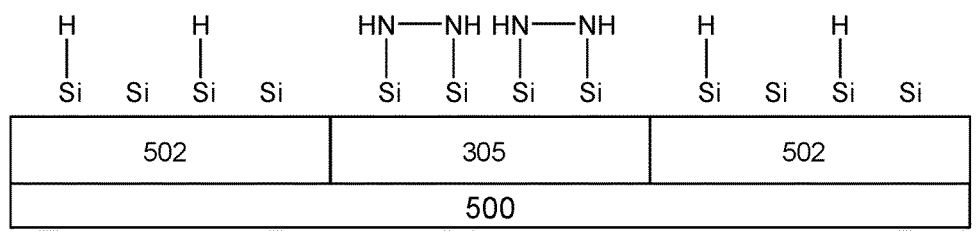

FIGS. 2 and 5 show example substrates that may be provided to the process chamber during operation 102 of FIG. 1.

FIG. 2 shows a substrate 200 having exposed silicon surfaces 202 where some silicon atoms are hydrogenated while others are not. The substrate 200 also includes exposed silicon oxide 203 with some hydroxyl-terminated groups in some oxygen bonded groups. Silicon surfaces 202 of FIG. 2 is an example of an exposed first surface of a semiconductor substrate as described with respect to operation 102 of FIG. 1. Silicon oxide 203 having hydroxyl-terminated groups is an example of an exposed second surface of a semiconductor substrate as described with respect to operation 102 of FIG. 1. In some embodiments, the silicon oxide surface 203 may include only or mostly hydroxyl-terminated groups.

FIG. 5 shows a substrate 500 having exposed silicon surfaces 502 where some silicon atoms are hydrogenated while others are not. The substrate 500 also includes exposed silicon nitride 305 with secondary amine dimer terminated groups (Si—NH). Silicon surfaces 502 of FIG. 5 are examples of exposed first surfaces of a semiconductor substrate as described with respect to operation 102 of FIG. 1. Silicon nitride 305 having secondary amine dimer terminated groups is an example of an exposed second surface of a semiconductor substrate as described with respect to operation 102 of FIG. 1. Silicon nitride 305 includes Si—NH dimers on the surface, whereby nitrogen atoms are bonded to an adjacent nitrogen atom. Such a surface may form if the silicon nitride material is deposited using chemical vapor deposition at a low temperature, such as less than 500° C. However, such surfaces may not be susceptible to reacting with acyl chlorides and would not be effectively blocked from deposition to allow selective deposition.

Thus, in operation 104, the substrate is optionally pre-treated to convert secondary amine dimer groups on the surface of the silicon nitride surface to primary amine groups. This operation is not optional if the silicon nitride surface includes Si—NH dimers. A silicon nitride surface having Si—NH dimers may be pre-treated by exposing the substrate to a nitrogen-containing and hydrogen-containing gas and/or plasma. For example, in some embodiments, the substrate is exposed to a mixture of ammonia gas and hydrogen gas, where the volume of ammonia gas in the mixture is less than about 1%. In some embodiments, the substrate is exposed to a mixture of nitrogen gas and hydrogen gas, where the volume of nitrogen gas in the mixture is less than about 1%. In some embodiments, pre-treatment is performed by flowing the nitrogen-containing and hydrogen-containing gas and igniting a plasma.

Figure 6:
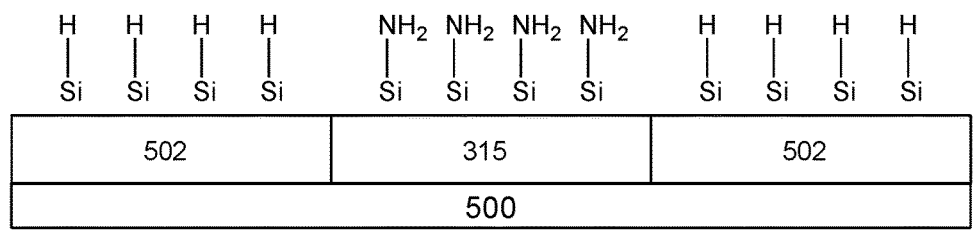

As shown in FIG. 6, when the substrate is pre-treated, the Si—NH dimers on the silicon nitride surface 305 are converted to primary amine groups (shown on silicon nitride surface 315) that include single —NH$_x$ groups, which are susceptible to reacting with acyl chlorides. Primary amine groups as referred to herein are defined as groups of atoms where nitrogen is bonded to silicon and hydrogen and the nitrogen atom is not bound to another nitrogen atom. A primary amine group on the surface of a silicon nitride substrate may have the structure Si—NH$_2$. Such groups are susceptible to reacting with acyl chlorides. This allows the silicon nitride surface 315 to react with acyl chlorides, which blocks the silicon nitride surface from deposition of silicon oxide, silicon nitride, or metal-containing dielectric material in subsequent operations, thereby allowing selective deposition on the exposed first surface.

Returning to FIG. 1, in operation 106, the substrate is exposed to an acyl chloride to block the exposed second surface of the substrate. The exposure may form a ketone-terminated or aldehyde-terminated surface on the exposed second surface of the substrate, thereby blocking it from subsequent film deposition.

The acyl chloride may have the chemical structure:

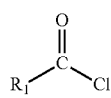

where R$_1$ is a hydrogen or an alkyl group. In some embodiments, R$_1$ is a methyl group such that the acyl chloride is acetyl chloride having the chemical structure:

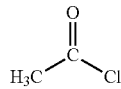

Figure 3:
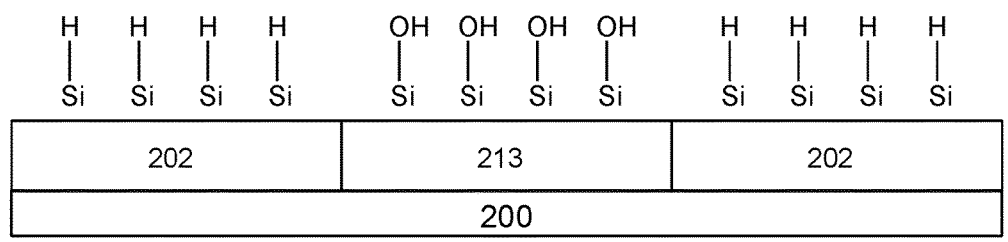
Figure 4:
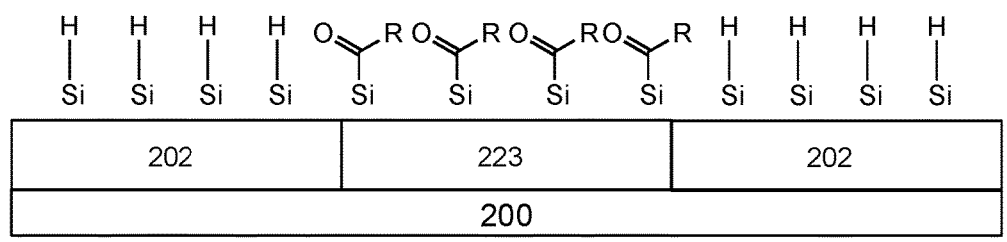

The acyl chloride is reactive with hydroxyl-terminated silicon surfaces on the semiconductor substrate and has little to no reactivity with the exposed first surface, which may be, in some embodiments, a hydrogen-terminated silicon surface such as shown in FIG. 4. As shown in FIG. 4, an acyl chloride having a generic alkyl group R reacts with the hydroxyl-terminated surface 213 of FIG. 3 to form blocking groups 223 which as shown here are ketone groups, while adjacent hydrogen-terminated silicon surfaces 202 remain unreacted.

Figure 7:
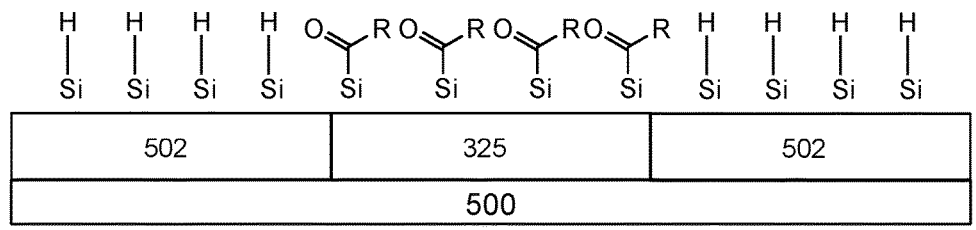

In the alternative embodiment provided in FIGS. 5-7 whereby the surface to be blocked is a silicon nitride surface, after hydrogenating the silicon surfaces 502 and exposing the substrate to ammonia and/or nitrogen plasma, the substrate 500 as shown in FIG. 6 includes primary amine-terminated (—NH$_2$) silicon surface 315, and hydrogen-terminated silicon surfaces 502. In FIG. 7, the substrate 500 of FIG. 6 is exposed to an acyl chloride such that the acyl chloride reacts with the primary amine-terminated silicon nitride surface 315 to form blocking groups 325, while adjacent hydrogen-terminated silicon surfaces 502 remain unreacted. While the underlying material under the blocking groups 325 is silicon nitride, the structure on the surface in FIG. 7 is similar to that of FIG. 4, where the underlying material is silicon oxide.

The acyl chloride is selected such that the acyl chloride is reactive with the exposed first surface to be blocked and is non-reactive or substantially less reactive with the surface upon which material is to be deposited (exposed second surface). For example, the activation energy to react the acyl chloride with the hydrogen-terminated silicon surface may be substantially lower than the activation energy used to react the acyl chloride with a primary amine-terminated or hydroxyl-terminated silicon nitride or oxide surface respectively. Thus, operation 106 of FIG. 1 selectively blocks the surface upon which deposition is not desired, while leaving other surfaces exposed for subsequent deposition. Operation 106 is performed prior to selectively depositing silicon oxide or silicon nitride on the substrate.

In some embodiments, a carrier gas may be flowed during operation 106. The carrier gas may be an inert gas, such as argon, hydrogen, helium, neon, and combinations thereof. The carrier gas may be diverted such that the carrier gas is used to deliver the ammonia and/or nitrogen gas to the process chamber. In some embodiments, the carrier gas may be provided to assist with pressure and/or temperature control of the process chamber. In some embodiments, the carrier gas is used to ensure more rapid delivery of a gas to the process chamber. In various embodiments, operation 106 is performed once before depositing the silicon-containing dielectric or metal-containing dielectric material on the substrate.

In operation 108, the substrate is exposed a silicon-containing precursor to adsorb onto the exposed first surface. Operations 108, 110, 111, and 114 may constitute an atomic layer deposition cycle. Similarly, operations 108, 110, 112, and 114 may also constitute an atomic layer deposition cycle. Although examples provided herein involve deposition of a silicon-containing film such as silicon oxide or silicon nitride on the exposed first surface, it will be understood that other materials such as metal-containing dielectric materials may also be deposited on the exposed first surface so long as the deposition conditions and precursors are such that the blocked second surface is not deteriorated or damaged by the deposition conditions or precursors.

The silicon-containing precursor used during operation 108 may be an aminosilane in some embodiments. Aminosilanes referred to herein include aminosilanes, such as bis(tertbutyl)aminosilane and silylamines such as trisilylamine. In some embodiments, aminosilane molecules may adsorb onto both silicon and silicon nitride or oxide surfaces, but as described below with respect to operation 110, silicon oxide is formed selectively on the exposed first surface (such as a silicon surface) and not on the exposed second surface (such as silicon nitride surface). In various embodiments, subsequent purge operations as described below with respect to operations 108 and 112 may remove adsorbed aminosilane from the exposed second surface.

In some embodiments, adsorption on the surface of the substrate may be form a thin layer of the aminosilane on most or the entirety of the surface of the substrate. The thin layer may be less than a monolayer, and may have a thickness between about 0.2 Å and about 0.4 Å.

During operation 108, an inert gas may be flowed. The inert gas may be any inert gas, such as those listed above with respect to operation 106. The inert gas may be provided to assist with pressure and/or temperature control of the process chamber, evaporation of a liquid reactant, more rapid delivery of the reactant.

The aminosilane used in operation 108 has a chemical formula as follows:

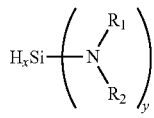

where x is an integer between and including 1 and 3, x+y=4 and each of $R_1$ and $R_2$ is hydrogen or an alkyl ligand. For example, in some embodiments, the aminosilane is monoaminosilane, which has the chemical structure:

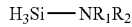

where each of $R_1$ and $R_2$ is hydrogen or an alkyl ligand.

The aminosilane in some embodiments may be any of monoaminosilane, diaminosilane, triaminosilane, tetraaminosilane, and combinations thereof. Chemical structures for these examples are provided below:

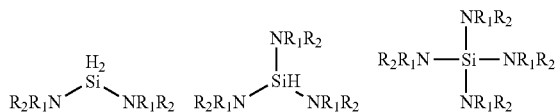

As noted above, $R_1$ and $R_2$ may be any alkyl ligand. In one example, the aminosilane may be N'N'-dimethylsilanediamine, having the structure:

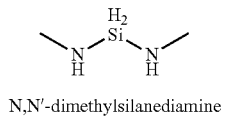

N,N'-dimethylsilanediamine

Other silicon-containing precursors include silicon alkoxides and silicon halides, which may be used in some embodiments. Example silicon halides include but are not limited to silicon chloride, silicon iodide, and silicon bromide.

In operation 110, the process chamber is optionally purged to remove aminosilane that did not adsorb onto the substrate surface. Purging the chamber may involve flowing a purge gas or a sweep gas, which may be a carrier gas used in other operations or may be a different gas. In some embodiments, purging may involve evacuating the chamber. The purge gas may be an inert gas in some embodiments. The purge gas may act as a sweep gas for removing process gases from the process chamber and/or process chamber plumbing. Example purge gases include argon, nitrogen, hydrogen, helium, neon, and combinations thereof. In some embodiments, operation 110 may include one or more evacuation subphases for evacuating the process chamber. Alternatively, it will be appreciated that operation 110 may be omitted in some embodiments. Operation 110 may have any suitable duration, such as between about 0 seconds and about 60 seconds, for example about 0.01 seconds. In some embodiments, increasing a flow rate of one or more purge gases may decrease the duration of operation 110. For example, a purge gas flow rate may be adjusted according to various reactant thermodynamic characteristics and/or geometric characteristics of the process chamber and/or process chamber plumbing for modifying the duration of operation 110. In one non-limiting example, the duration of a purge phase may be adjusted by modulating purge gas flow rate. This may reduce deposition cycle time, which may improve substrate throughput. After a purge, the aminosilane molecules remain adsorbed onto the substrate surface. In some embodiments, the aminosilane precursor is flowed to a chamber housing the substrate at a flow rate between about 1000 sccm and about 5000 sccm.

In FIG. 1, if silicon oxide is to be selectively deposited on the substrate, during operation 111, the substrate is exposed to a weak oxidant without a plasma to selectively form silicon oxide on the exposed first surface. A weak oxidant is selected such that the weak oxidant does not react with the blocked second surface of the substrate. A plasma is not used during this operation so as not to remove the blocking groups (e.g., ketone-terminated groups) on the surface of the blocked second surface. When the weak oxidant is provided to the substrate, the adsorbed precursor reacts with the weak oxidant to form silicon oxide on the surface of the exposed first surface. In contrast, since the blocked second surface includes a bulky alkyl group on the surface, the silicon-containing precursor in operation 106 may not necessarily adsorb onto the ketone-terminated surface and therefore silicon oxide is not formed on the exposed second surface and selective deposition is achieved. Example weak oxidants include water, hydrogen peroxide, and ozone. In various embodiments, a highly reduced form of an oxidant is used as a weak oxidant for this operation.

Figure 8:
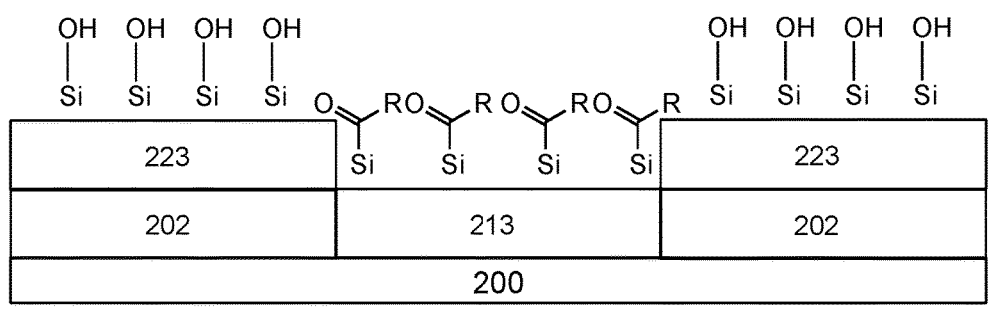

FIG. 8 shows an example of the substrate from FIG. 4, whereby silicon oxide 223 is deposited selectively on the silicon surfaces 202 without depositing on the blocked second surface 213.

Returning to FIG. 1, if silicon nitride is selectively deposited on the substrate, operation 112 may be performed in lieu of operation 111. During operation 112, the substrate is exposed to ammonia or hydrazine without a plasma to selectively form silicon nitride on the exposed first surface. Hydrazines used during operation 112 have the structure:

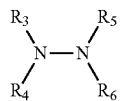

where $R_3$, $R_4$, $R_5$, and $R_6$ are each hydrogen or alkyl groups. For example, hydrazine may be used, whereby hydrazine has the structure:

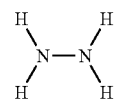

In another example, t-butylhydrazine, which has the following structure, may be used:

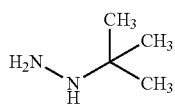

In another example, tetramethyl hydrazine, which has the following structure, may be used:

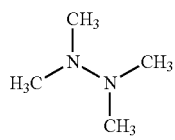

Ammonia or a hydrazine is selected such that ammonia or the hydrazine does not react with the blocked second surface of the substrate. A plasma is not used during this operation so as not to remove the ketone-terminated surface of the blocked second surface. When ammonia or a hydrazine is provided to the substrate, the adsorbed precursor reacts with the ammonia or hydrazine to form silicon nitride on the surface of the exposed first surface. In contrast, since the blocked second surface includes a bulky alkyl group on the surface, the silicon-containing precursor in operation 108 may not necessarily adsorb onto the ketone-terminated surface and therefore silicon nitride is not formed on the exposed second surface and selective deposition is achieved. In various embodiments, a highly reduced form of a nitrogen-containing reactant is used during this operation.

Figure 9:
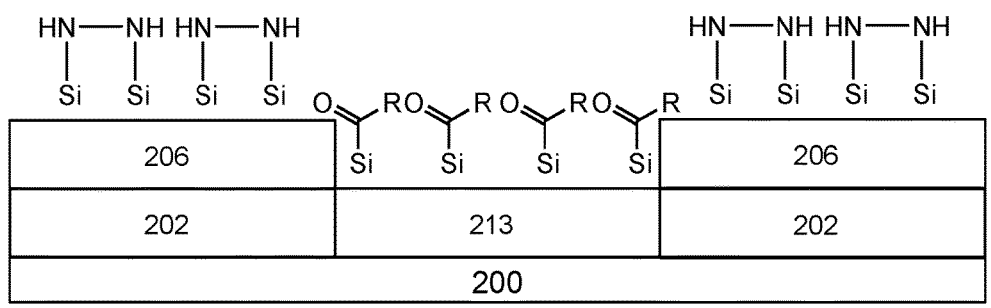

FIG. 9 shows an example of the substrate from FIG. 4, whereby silicon nitride 206 is deposited selectively on the silicon surfaces 202 without depositing on the blocked second surface 213.

In operation 114, the chamber is optionally purged to remove any residual byproducts. Operation 114 may be purged using any of the conditions described above with respect to operation 110.

In operation 116, it is determined whether the desired thickness of film has been deposited. If not, operations 108, 110, 111, and 114 are repeated in sufficient cycles to deposit a desired thickness of silicon oxide film selectively on the first exposed surface. Alternatively, operations 108, 110, 112, and 114 are repeated in sufficient cycles to deposit a desired thickness of silicon nitride film selectively on the first exposed surface. Any suitable number of deposition cycles may be included in an ALD process to deposit a desired film thickness of silicon oxide or silicon nitride. For example, about fifty deposition cycles may be performed to deposit a film on the substrate using disclosed embodiments.

Note that while FIG. 1 and the description provided herein describe the exposure to a silicon-containing precursor occurring before weak oxidant or ammonia/hydrazine exposure, it will be understood that in some embodiments, weak oxidant or ammonia/hydrazine exposure may be performed prior to silicon-containing precursor exposure. That is, in some embodiments, after operation 106, operation 111 or 112 may be performed, followed by a purge operation such as operation 114, then operation 108 may be performed, followed by purge operation 110. In some embodiments, following operation 106, operation 108 is performed, followed by operation 110, and operation 111 or 112, and 114.

Figure 10:
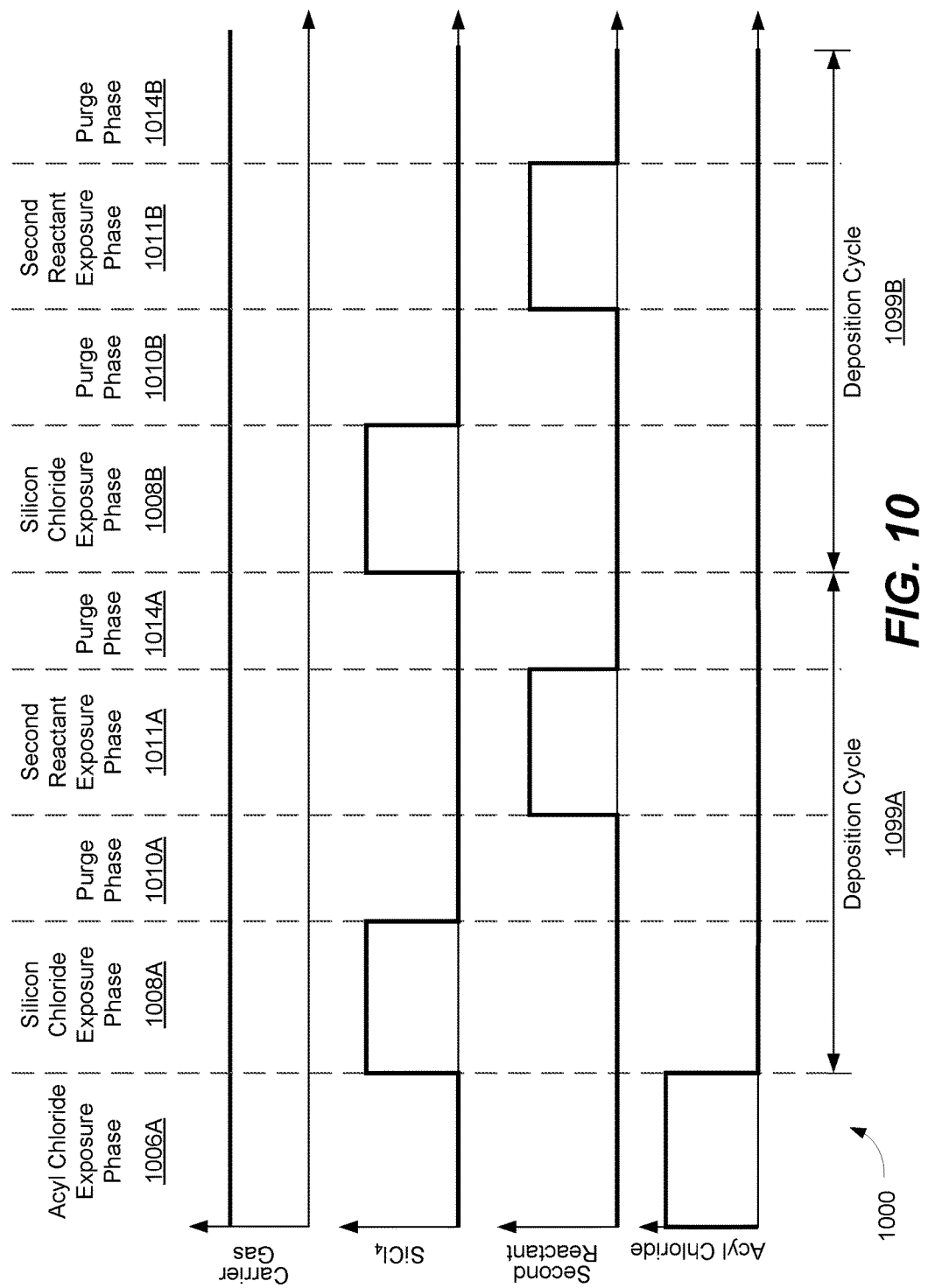
FIG. 10 is a timing sequence diagram showing examples of cycles performed in a method in accordance with certain disclosed embodiments.

FIG. 10 is a timing sequence diagram showing an example of cycles in a method performed in accordance with certain disclosed embodiments. The timing sequence diagram shows the on or off phase for flows of a carrier gas, silicon chloride gas, second reactant gas (such as a weak oxidant, or ammonia, or a hydrazine), and an acyl chloride gas. Although silicon chloride is provided as a silicon precursor in the example of FIG. 3, it will be understood that any suitable silicon-containing precursor may be used in lieu of silicon chloride.

FIG. 10 includes a process 1000 having two deposition cycles 1099A and 1099B, whereby deposition cycle 1099A constitutes an ALD cycle and deposition cycle 1099B also constitutes an ALD cycle. Although only two deposition cycles are depicted, more deposition cycles may be used. Process 1000 begins with acyl chloride exposure phase 1006A which may correspond to operation 106 of FIG. 1. During acyl chloride exposure phase 1006A, a carrier gas flow is turned on. The carrier gas may be any of those described above with respect to operations 106-114 of FIG. 1. During acyl chloride exposure phase 1006A, silicon chloride flow and second reactant flows are turned off while acyl chloride flow is turned on. Following acyl chloride exposure phase 1006A, deposition cycle 1099A is performed, which includes silicon chloride exposure phase 1008A, purge phase 1010A, second reactant exposure phase 1011A, and purge phase 1014A. During silicon chloride exposure phase 1008A, a carrier gas may continue to flow while silicon chloride flow is turned on. Second reactant flow remains off and acyl chloride flow is turned off. This may correspond to operation 108 of FIG. 1. During purge phase 1010A, which may correspond to operation 110 of FIG. 1, carrier gas flow continues to flow and may be used as a purge gas, while silicon chloride flow, second reactant flow, and acyl chloride flow are all off. During second reactant exposure phase 1011A, carrier gas flow may continue to flow while second reactant flow is turned on and silicon chloride and acyl chloride flows remain off. This may correspond to operation 111 of FIG. 1 for silicon oxide deposition or operation 112 of FIG. 1 for silicon nitride deposition, depending on the material being deposited. In purge phase 1014A, the carrier gas flow remains on while silicon chloride flow, second reactant flow, and acyl chloride flows are turned off. This may correspond to operation 114 of FIG. 1. Following this phase it is determined to repeat the operations for depositing the film such that deposition cycle 1099B is repeated. Accordingly, following deposition cycle 1099A, deposition cycle 1099B is performed, which includes silicon chloride exposure phase 1008B, purge phase 1010B, second reactant exposure phase 1011B, and purge phase 1014B. Like deposition cycle 1099A, during silicon chloride exposure phase 1008B, carrier gas and silicon chloride flows are turned on while second reactant gas and acyl chloride flows are turned off. This may correspond to a repeated operation of operation 108 of FIG. 1. In purge phase 1010B, the carrier gas is flowed while silicon chloride flow, second reactant flow, and acyl chloride flows are turned off. During second reactant exposure phase 1011B, carrier gas flow and second reactant gas flows are turned on while silicon chloride and acyl chloride flows are turned off. Purge phase 1014B may include carrier gas flows turned on while silicon chloride, second reactant, and acyl chloride gas flows are all turned off. Subsequent deposition cycles may follow.

Apparatus

Figure 11:
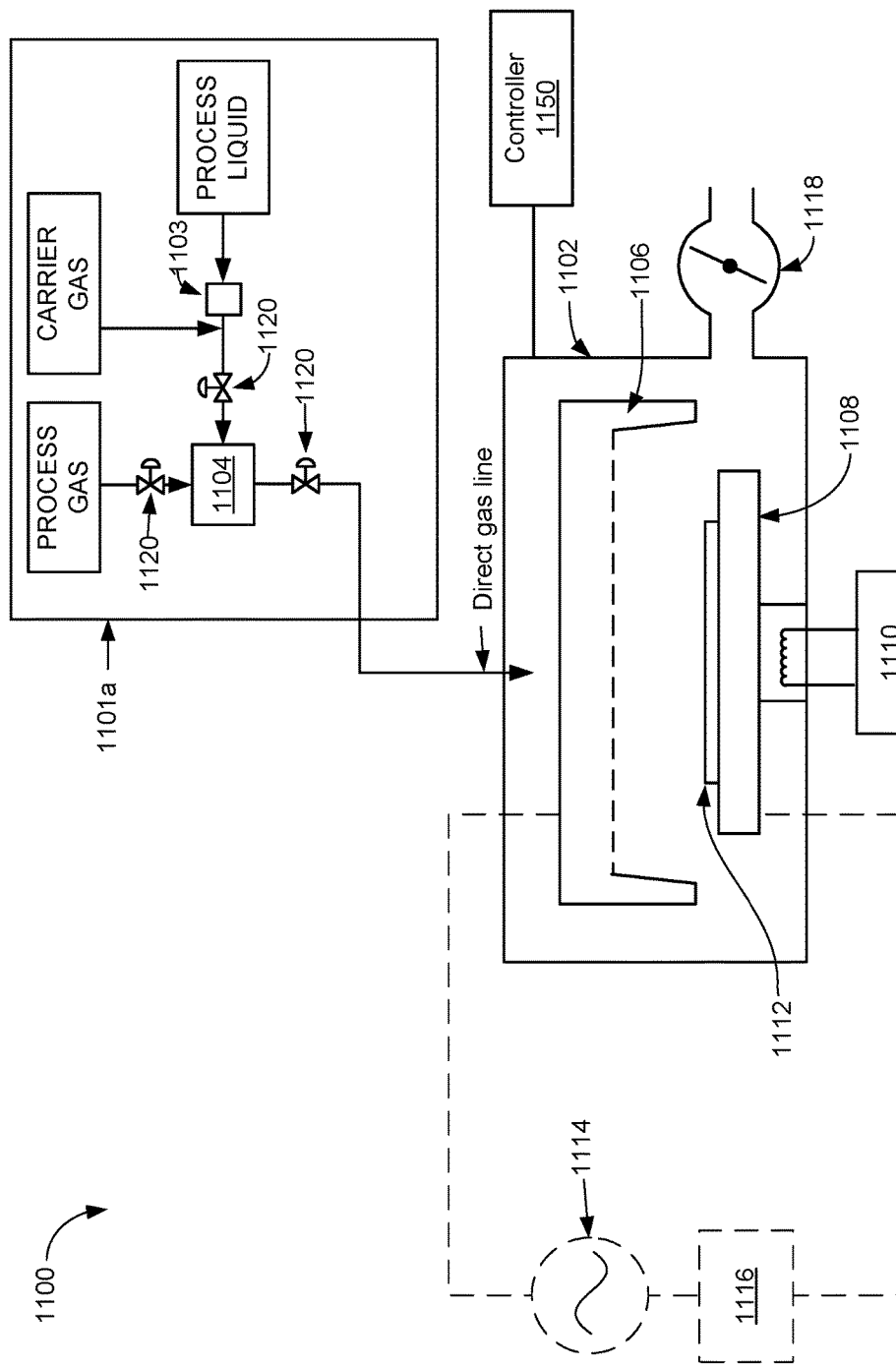
FIG. 11 is a schematic diagram of an example process chamber for performing certain disclosed embodiments.
Figure 12:
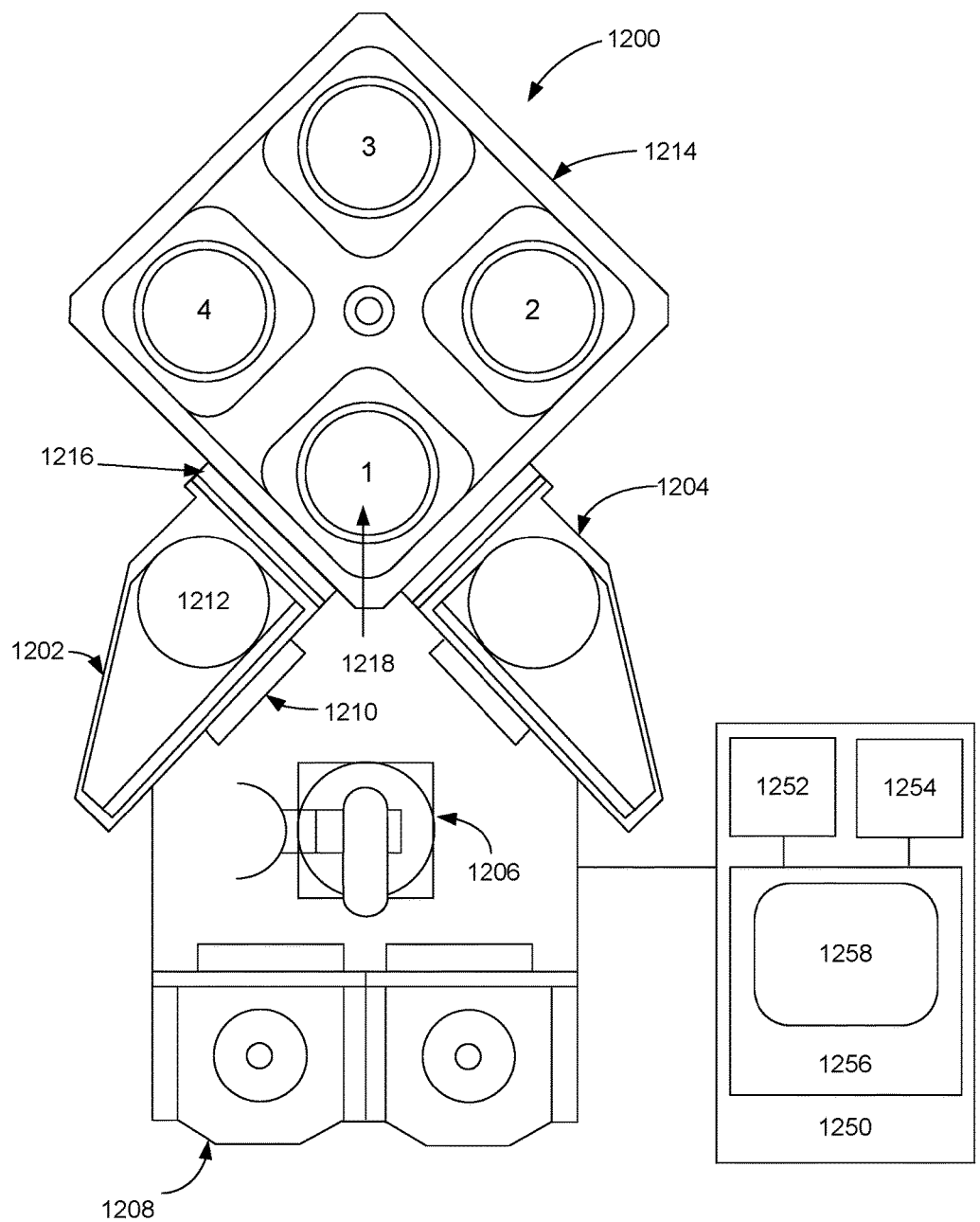
FIG. 12 is a schematic diagram of an example process tool for performing certain disclosed embodiments.

FIG. 11 depicts a schematic illustration of an embodiment of an atomic layer deposition (ALD) process station 1100 having a process chamber body 1102 for maintaining a low-pressure environment. A plurality of ALD process stations 1100 may be included in a common low pressure process tool environment. For example, FIG. 12 depicts an embodiment of a multi-station processing tool 1200. In some embodiments, one or more hardware parameters of ALD process station 1100 including those discussed in detail below may be adjusted programmatically by one or more computer controllers 1150.

ALD process station 1100 fluidly communicates with reactant delivery system 1101a for delivering process gases to a distribution showerhead 1106. Reactant delivery system 1101a includes a mixing vessel 1104 for blending and/or conditioning process gases, such as an acyl chloride, silicon-containing precursor gas, weak oxidant gas, ammonia gas, or hydrazine gas, for delivery to showerhead 1106. One or more mixing vessel inlet valves 1120 may control introduction of process gases to mixing vessel 1104.

As an example, the embodiment of FIG. 11 includes a vaporization point 1103 for vaporizing liquid reactant to be supplied to the mixing vessel 1104. In some embodiments, vaporization point 1103 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 1103 may be heat traced. In some examples, mixing vessel 1104 may also be heat traced. In one non-limiting example, piping downstream of vaporization point 1103 has an increasing temperature profile extending from approximately 100° C. to approximately 150° C. at mixing vessel 1104.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1103. In one scenario, a liquid injector may be mounted directly to mixing vessel 1104. In another scenario, a liquid injector may be mounted directly to showerhead 1106.

In some embodiments, a liquid flow controller (LFC) upstream of vaporization point 1103 may be provided for controlling a mass flow of liquid for vaporization and delivery to process station 1100. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 1106 distributes process gases toward substrate 1112. In the embodiment shown in FIG. 11, the substrate 1112 is located beneath showerhead 1106 and is shown resting on a pedestal 1108. Showerhead 1106 may have any suitable shape, and may have any suitable number and arrangement of ports for distributing process gases to substrate 1112.

In some embodiments, pedestal 1108 may be raised or lowered to expose substrate 1112 to a volume between the substrate 1112 and the showerhead 1106. It will be appreciated that, in some embodiments, pedestal height may be adjusted programmatically by a suitable computer controller 1150.

In another scenario, adjusting a height of pedestal 1108 may allow a plasma density to be varied during plasma activation cycles in the process in embodiments where a plasma is ignited. At the conclusion of the process phase, pedestal 1108 may be lowered during another substrate transfer phase to allow removal of substrate 1112 from pedestal 1108.

In some embodiments, pedestal 1108 may be temperature controlled via heater 1110. In some embodiments, the pedestal 1108 may be heated to a temperature of between about 25° C. and about 400° C., or between about 200° C. and about 300° C., during selective deposition of silicon nitride films as described in disclosed embodiments. In some embodiments, the pedestal is set at a temperature between about 25° C. and about 400° C., or between about 200° C. and about 300° C.

Further, in some embodiments, pressure control for process station 1100 may be provided by butterfly valve 1118. As shown in the embodiment of FIG. 11, butterfly valve 1118 throttles a vacuum provided by a downstream vacuum pump (not shown). However, in some embodiments, pressure control of process station 1100 may also be adjusted by varying a flow rate of one or more gases introduced to the process station 1100.

In some embodiments, a position of showerhead 1106 may be adjusted relative to pedestal 1108 to vary a volume between the substrate 1112 and the showerhead 1106. Further, it will be appreciated that a vertical position of pedestal 1108 and/or showerhead 1106 may be varied by any suitable mechanism within the scope of the present disclosure. In some embodiments, pedestal 1108 may include a rotational axis for rotating an orientation of substrate 1112. It will be appreciated that, in some embodiments, one or more of these example adjustments may be performed programmatically by one or more suitable computer controllers 1150.

In some embodiments where plasma may be used as discussed above, such as for treating a silicon nitride surface, showerhead 1106 and pedestal 1108 electrically communicate with a radio frequency (RF) power supply 1114 and matching network 1116 for powering a plasma. In some embodiments, the plasma energy may be controlled by controlling one or more of a process station pressure, a gas concentration, an RF source power, an RF source frequency, and a plasma power pulse timing. For example, RF power supply 1114 and matching network 1116 may be operated at any suitable power to form a plasma having a desired composition of radical species. Examples of suitable powers are about 150 W to about 6000 W. RF power supply 1114 may provide RF power of any suitable frequency. In some embodiments, RF power supply 1114 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1150 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an acyl chloride gas, instructions for setting a flow rate of a carrier gas (such as argon), and time delay instructions for the first recipe phase. A second recipe phase may include instructions for setting a flow rate of an inert and/or silicon-containing precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of a weak oxidant, ammonia, or hydrazine gas, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 1150 may include any of the features described below with respect to system controller 1250 of FIG. 12.

As described above, one or more process stations may be included in a multi-station processing tool. FIG. 12 shows a schematic view of an embodiment of a multi-station processing tool 1200 with an inbound load lock 1202 and an outbound load lock 1204, either or both of which may include a remote plasma source. A robot 1206 at atmospheric pressure is configured to move wafers from a cassette loaded through a pod 1208 into inbound load lock 1202 via an atmospheric port 1210. A wafer is placed by the robot 1206 on a pedestal 1212 in the inbound load lock 1202, the atmospheric port 1210 is closed, and the load lock is pumped down. Where the inbound load lock 1202 includes a remote plasma source, the wafer may be exposed to an optional mild etchant of HF in $H_2O$ or may be exposed to ambient in the load lock prior to being introduced into a processing chamber 1214. Further, the wafer also may be heated in the inbound load lock 1202 as well, for example, to remove moisture and adsorbed gases. Next, a chamber transport port 1216 to processing chamber 1214 is opened, and another robot (not shown) places the wafer into the reactor on a pedestal of a first station shown in the reactor for processing. While the embodiment depicted in FIG. 12 includes load locks, it will be appreciated that, in some embodiments, direct entry of a wafer into a process station may be provided.

The depicted processing chamber 1214 includes four process stations, numbered from 1 to 4 in the embodiment shown in FIG. 12. Each station has a heated pedestal (shown at 1218 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 1214 may include one or more matched pairs of ALD and plasma-enhanced ALD process stations. While the depicted processing chamber 1214 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 12 depicts an embodiment of a wafer handling system 1290 for transferring wafers within processing chamber 1214. In some embodiments, wafer handling system 1290 may transfer wafers between various process stations and/or between a process station and a load lock. It will be appreciated that any suitable wafer handling system may be employed. Non-limiting examples include wafer carousels and wafer handling robots. FIG. 12 also depicts an embodiment of a system controller 1250 employed to control process conditions and hardware states of process tool 1200. System controller 1250 may include one or more memory devices 1256, one or more mass storage devices 1254, and one or more processors 1252. Processor 1252 may include a CPU or computer, analog, and/or digital input/output connections, stepper motor controller boards, etc.

In some embodiments, system controller 1250 controls all of the activities of process tool 1200. System controller 1250 executes system control software 1258 stored in mass storage device 1254, loaded into memory device 1256, and executed on processor 1252. Alternatively, the control logic may be hard coded in the controller 1250. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1258 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 1258 may be configured in any suitable way. For example, various process tool component subroutines or control objects may be written to control operation of the process tool components used to carry out various process tool processes. System control software 1258 may be coded in any suitable computer readable programming language.

In some embodiments, system control software 1258 may include input/output control (IOC) sequencing instructions for controlling the various parameters described above. Other computer software and/or programs stored on mass storage device 1254 and/or memory device 1256 associated with system controller 1250 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., acyl chloride gases such as acetyl chloride, silicon-containing precursor gases such as silicon chloride or an aminosilane, and weak oxidant, ammonia, or hydrazine gases, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1250. The user interface may include a display screen, graphical software displays of the apparatus and/or process conditions, and user input devices such as pointing devices, keyboards, touch screens, microphones, etc.

In some embodiments, parameters adjusted by system controller 1250 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1250 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1250 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 1250 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1250.

In some implementations, the system controller 1250 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1250, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1250 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1250 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1250, in some implementations, may be a part of or coupled to a computer that is integrated with, coupled to the system, otherwise networked to the system, or a combination thereof. For example, the system controller 1250 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1250 receives instructions in the form of data, which specify parameters for each of the processing steps to be performed during one or more operations. It should be understood that the parameters may be specific to the type of process to be performed and the type of tool that the system controller 1250 is configured to interface with or control. Thus as described above, the system controller 1250 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 1250 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for selectively depositing a silicon-containing dielectric material on an exposed first surface of a substrate, the method comprising:
   providing the substrate having the exposed first surface, and an exposed second surface,
      the exposed first surface having a material selected from the group consisting of polysilicon, amorphous silicon, metals, and silicon nitride having single secondary amine terminated groups, and
      the exposed second surface comprising a silicon-containing material having a surface terminated group selected from the group consisting of hydroxyl and primary amine;
   prior to depositing the silicon-containing dielectric material, exposing the substrate to an acyl chloride selectively reactive with the exposed second surface to form blocking groups on the exposed second surface, the acyl chloride having a chemical structure of

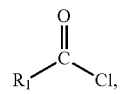

wherein $R_1$ is hydrogen or an alkyl group; and
   performing one or more cycles of thermal atomic layer deposition to deposit the silicon-containing dielectric material selectively on the exposed first surface, each cycle comprising:
      exposing the substrate to a silicon-containing precursor selected to adsorb onto the exposed first surface of the substrate, and
      exposing the substrate to a second reactant to form the silicon-containing dielectric material selectively on the exposed first surface of the substrate.

2. The method of claim 1, wherein the silicon-containing dielectric material is silicon nitride.

3. The method of claim 2, wherein the second reactant selected from the group consisting of ammonia and hydrazines having the chemical structure

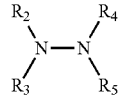

wherein $R_2$, $R_3$, $R_4$, and $R_5$ are each hydrogen or an alkyl group.

4. The method of claim 2, wherein the silicon-containing precursor is selected from the group consisting of silicon halides and aminosilanes.

5. The method of claim 1, wherein the silicon-containing dielectric material is silicon oxide.

6. The method of claim 5, wherein the second reactant is a weak oxidant.

7. The method of claim 5, wherein the second reactant is selected from the group consisting of water, hydrogen peroxide, and ozone.

8. The method of claim 1, wherein the acyl chloride is acetyl chloride.

9. The method of claim 1, further comprising, prior to providing the substrate, depositing silicon nitride to form an untreated silicon nitride surface; and exposing the untreated silicon nitride surface to a mixture of ammonia and hydrogen gas and igniting a plasma for a duration between about 1 second and about 10 seconds to form the exposed second surface comprising primary amine groups.

10. The method of claim 9, wherein the amount of ammonia in the mixture of ammonia and hydrogen is less than about 1% by volume.

11. The method of claim 1, further comprising, prior to providing the substrate, depositing silicon nitride to form an untreated silicon nitride surface and exposing the untreated silicon nitride surface to a mixture of nitrogen and hydrogen gas and igniting a plasma for a duration between about 1 second and about 10 seconds to form the exposed second surface comprising primary amine groups.

12. The method of claim 11, wherein the amount of nitrogen in the mixture of nitrogen and hydrogen is less than about 1% by volume.

13. The method of claim 1, wherein the exposed second surface comprises surface terminated primary amine groups of silicon nitride deposited by chemical vapor deposition at a deposition temperature greater than about 500° C.

* * * * *